(12) United States Patent
Nishizawa et al.

(10) Patent No.: US 7,416,133 B2
(45) Date of Patent: Aug. 26, 2008

(54) IC CARD

(75) Inventors: Hirotaka Nishizawa, Fuchu (JP); Akira Higuchi, Takasaki (JP); Kenji Osawa, Hachioji (JP); Junichiro Osako, Kodaira (JP); Tamaki Wada, Suwa (JP)

(73) Assignee: Renesas Technology Corp., Tokyo (JP)

( * ) Notice: Subject to any disclaimer, the term of this patent is extended or adjusted under 35 U.S.C. 154(b) by 445 days.

(21) Appl. No.: 10/961,136

(22) Filed: Oct. 12, 2004

(65) Prior Publication Data
US 2005/0082375 A1   Apr. 21, 2005

(30) Foreign Application Priority Data
Oct. 20, 2003   (JP)   ............... 2003-359824

(51) Int. Cl.
*G05F 17/00*   (2006.01)
(52) U.S. Cl. .................. 235/492; 235/486; 439/325
(58) Field of Classification Search ................ 235/492, 235/486; 439/325
See application file for complete search history.

(56) References Cited

U.S. PATENT DOCUMENTS

| | | | | |
|---|---|---|---|---|
| 4,838,804 A | * | 6/1989 | Banjo et al. .................. | 439/325 |
| 6,256,878 B1 | * | 7/2001 | Keane .......................... | 29/841 |
| 2002/0076954 A1 | * | 6/2002 | Chen et al. .................. | 439/76.1 |
| 2003/0085285 A1 | * | 5/2003 | Luu ............................. | 235/486 |
| 2003/0166360 A1 | * | 9/2003 | Thornton et al. ............ | 439/630 |
| 2004/0201969 A1 | * | 10/2004 | Fong et al. ................... | 361/737 |
| 2006/0108430 A1 | * | 5/2006 | Osawa et al. ................ | 235/492 |
| 2006/0170084 A1 | * | 8/2006 | Masuda et al. .............. | 257/666 |

FOREIGN PATENT DOCUMENTS

| | | |
|---|---|---|
| JP | 2003/6576 | 1/2003 |
| JP | 2003-86293 | 3/2003 |
| JP | 2003-86296 | 3/2003 |
| JP | 2003-91700 | 3/2003 |

* cited by examiner

*Primary Examiner*—Michael G. Lee
*Assistant Examiner*—Allyson N Trail
(74) *Attorney, Agent, or Firm*—Miles & Stockbridge P.C.

(57) ABSTRACT

An IC card is prevented from falling off readily an electronic device while maintaining the mechanical strength of the IC card. A recess for preventing a memory card from falling off an electronic device is provided at the side of one side of a principal surface of a cap of the memory card which is configured by fitting a memory body in a recess formed on a parts mounting surface of the cap. The bottom of the recess is terminated in the middle of the thickness of the cap. This construction makes it possible to prevent the memory card from falling off readily an electronic device while maintaining the mechanical strength of the memory card.

39 Claims, 19 Drawing Sheets

IC CARD

CROSS REFERENCE TO RELATED APPLICATION

The present application claims priority from Japanese patent application No 2003-359824 filed on Oct. 20, 2003, the content of which is hereby incorporated by reference into this application.

BACKGROUND OF THE INVENTION

The present invention relates to IC (integrated circuit) card technology, and technology effectively applied to, e.g., semiconductor memory card (hereinafter referred to as a memory card).

Memory cards such as multimedia cards (standardized by the multimedia organization), SD memory cards (standardized by the SD card organization) or memory sticks (registered trademark of Sony Corp.) are a kind of storage devices to store information in their internal semiconductor memory chips. Since access can be made directly and electrically to nonvolatile memories of semiconductor memory chips without mechanical control, the memory cards have the excellent advantages of faster write and read speeds and easier replacement of storage media in comparison with other storage devices. Since the memory cards are compact in size and light in weight, they are primarily used as auxiliary storage devices of portable electronic devices such as portable personal computers, cellular phones, or digital cameras.

The appearance of a multimedia card is formed by a square-planar thin-plate cap having a corner largely chamfered. A memory body is fitted in and bonded to a recess on a parts mounting surface of the cap. The memory body includes a wiring board and semiconductor chips mounted on its principal surface. The semiconductor chips are sealed by a sealing part and are electrically connected with plural external terminals on the back surface of the wiring board through wiring of the wiring board. The plural external terminals on the back surface of the wiring board are exposed to the outside to be electrically connected with an electronic device in which the multimedia card is to be incorporated. The appearance of the above-mentioned SD card is formed by bonding together two square-planar thin-plate cases each having a corner largely chamfered. A memory body is sandwiched between the two cases. Plural openings are formed on the bask surface of one case of the SD card, and plural external terminals of the memory body are exposed from the openings. Through the openings of the case, the external terminals of the SD card and an electronic device in which the SD card is to be incorporated are electrically connected. The appearance of the above-mentioned memory stick is a rectangular thin plate having a corner largely chamfered. Like the SD card, a memory body is sandwiched between two cases.

By the way, in conventional multimedia cards, sufficient measures have not been taken against action of forcibly extracting the multimedia cards inserted into electronic devices and against cases where the multimedia cards pop out when the electronic devices drop. However, since the multimedia cards have often been used in electronic devices such as cellular phones and mobile computers, more and more electronic devices have had a slot structure so that the multimedia cards can be easily removed, for convenience of users' use. As a result, there has been an increase in action of forcibly extracting the multimedia cards and cases where the multimedia cards pop out readily when the electronic devices drop, and therefore it has become important to take appropriate measures against such situations.

In the above-mentioned SD card, sides of the two cases are provided with recesses penetrating from the principal surface to the back surface of the two cases, and the recesses are engaged with retainers of an electronic device. This construction prevents an SD card from being forcibly removed or from popping out readily due to slight impact (see Patent Documents 1, 2, and 3).

In the above-mentioned memory stick, a recess for fixing the memory stick in a desired position is provided at an edge of a case side at which external terminals of the case are exposed (see Patent Document 4).

[Patent document 1] Japanese Unexamined Patent Publication No. 2003-6576
[Patent document 2] Japanese Unexamined Patent Publication No. 2003-86293
[Patent document 3] Japanese Unexamined Patent Publication No. 2003-86296
[Patent document 4] Japanese Unexamined Patent Publication No. 2003-91700

SUMMARY OF THE INVENTION

However, memory cards such as multimedia cards whose appearance is formed by one cap are thinner and mechanically weaker than SD cards and memory sticks. Providing a recess without sufficient care would reduce mechanical strength and damage the card. Therefore, there is a problem in that it is impossible to provide even a small recess without sufficient care.

An object of the present invention is to provide technology that prevents an IC card from falling off readily an electronic device while maintaining the mechanical strength of the IC card.

The above-mentioned and other objects and novel characteristics of the present invention will become apparent from the description of this specification and the accompanying drawings.

The typical disclosures of the invention will be summarized in brief as follows.

Specifically, according to the present invention, in an IC card whose electronic part body is fitted in and bonded to or placed into tight contact with a recess on a parts mounting surface of a cap, a recess having a depth of a third to two thirds of the thickness of the cap from a principal surface of the cap is provided at a side of the cap.

Effects obtained by typical disclosures of the invention will be described in brief as follows.

An IC card can be prevented from falling off readily an electronic device while maintaining the mechanical strength of the IC card.

DESCRIPTION OF THE PREFERRED EMBODIMENTS

Figure 1:
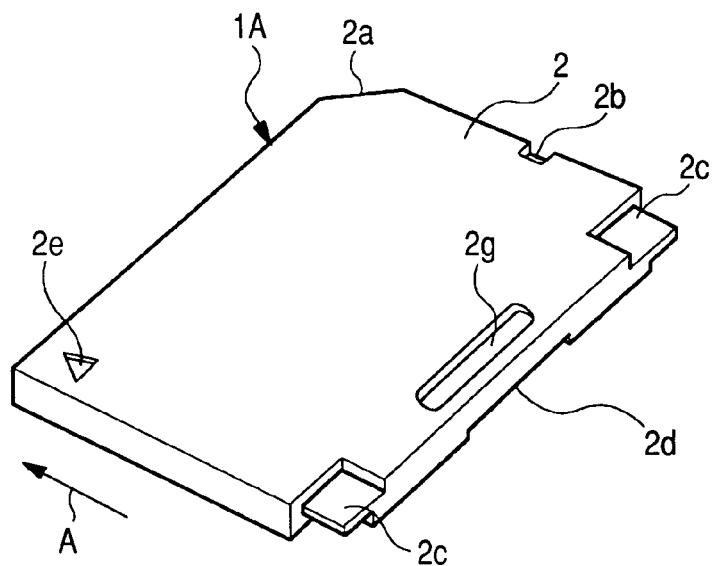
FIG. 1 is an overall perspective view of an IC card of one embodiment of the present invention when viewed from a principal surface thereof.

In embodiments below, descriptions will be made separately to plural sections or embodiments when required. Unless otherwise stated, they are not independent of each other, and one is dependent partially or wholly on others in terms of variants, details, additional descriptions, and the like. In the embodiments below, the number of elements (including count, numeric value, quantity, and range), when designated, are not limited to the designated number and may be around the designated number, except in cases where it is explicitly specified and cases where it is theoretically limited to the specific number. Furthermore, in the embodiments below, it goes without saying that components in the embodiments (including element steps and the like) are not always mandatory, except in cases where they are explicitly specified. Likewise, in the embodiments below, shapes, positional relations, and the like of components and the like, when designated, include similarities to the designated those, except in cases where they are explicitly specified and cases where the similarities are theoretically inappropriate. The same is also true for the above-mentioned numeric values and range. In all drawings for explaining the embodiments, elements having identical functions are identified by the same reference numerals and duplicate descriptions of them are omitted. Hereinafter, embodiments of the present invention will be described with reference to the accompanying drawings.

First Embodiment

Figure 2:
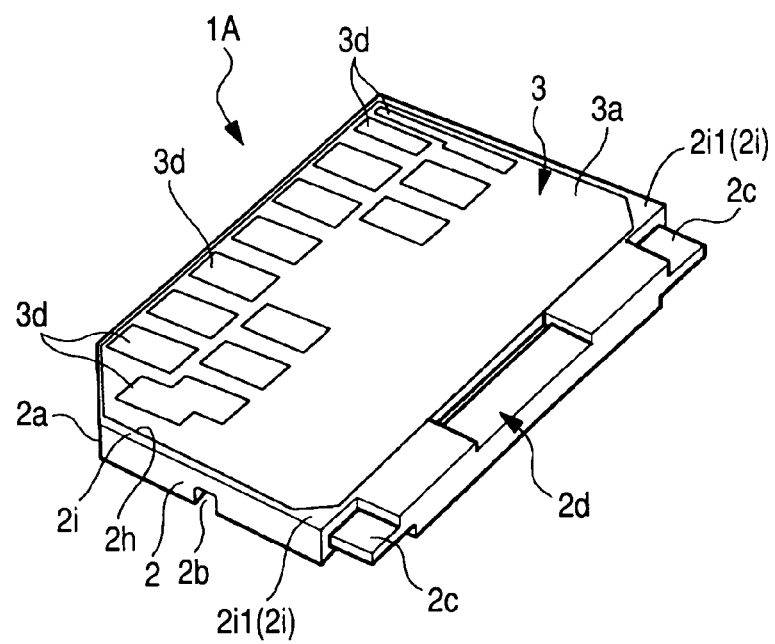
FIG. 2 is an overall perspective view of the IC card of FIG. 1 when viewed from a back surface thereof.
Figure 3:
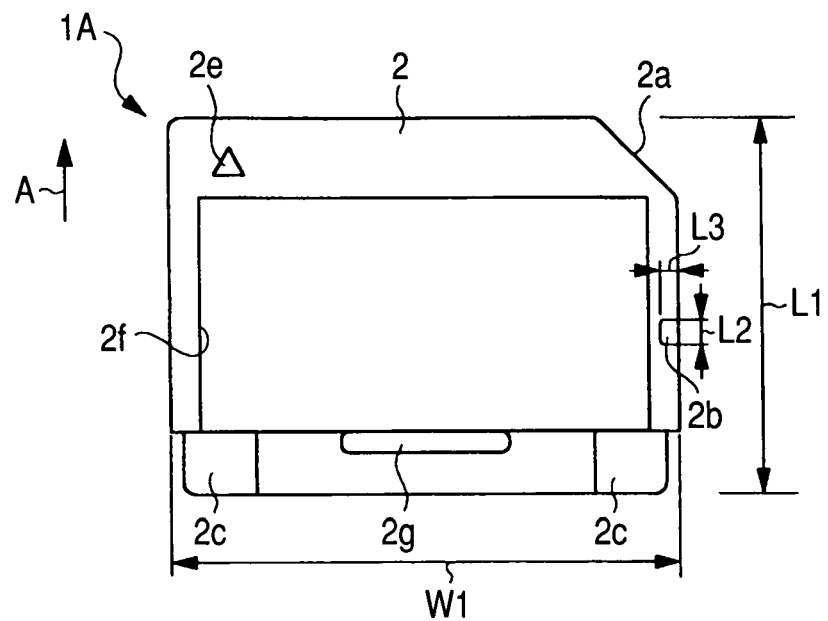
FIG. 3 is an overall plan view of the principal surface of the IC card of FIG. 1.
Figure 4:
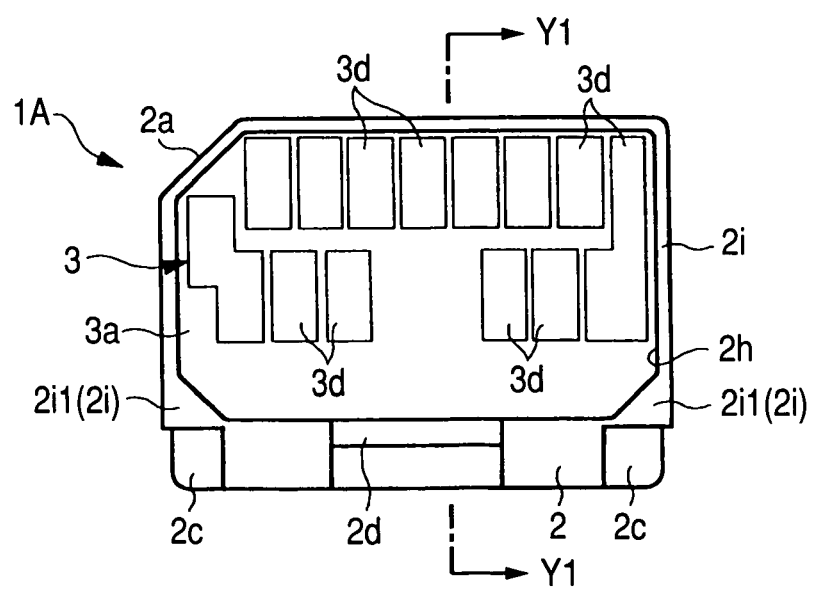
FIG. 4 is an overall plan view of the back surface of the IC card of FIG. 1.
Figure 5:
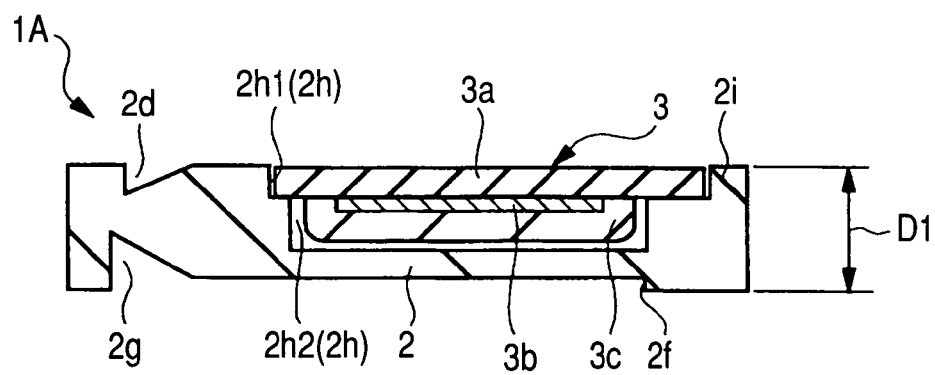
FIG. 5 is a sectional view along the line Y1-Y1 of FIG. 4.
Figure 6:
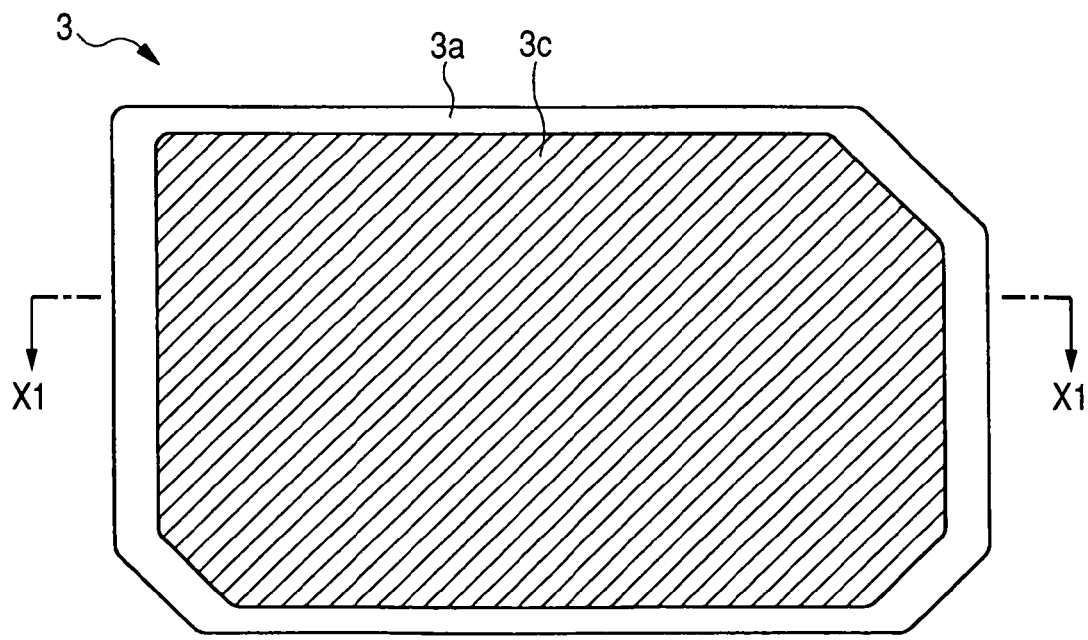
FIG. 6 is an overall plan view of a body of the IC card of FIG. 1.
Figure 7:
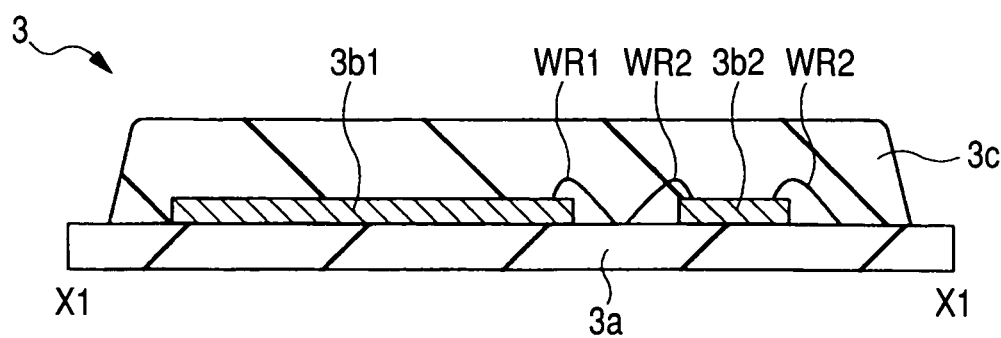
FIG. 7 is a sectional view along the line X1-X1 of FIG. 6.
Figure 8:
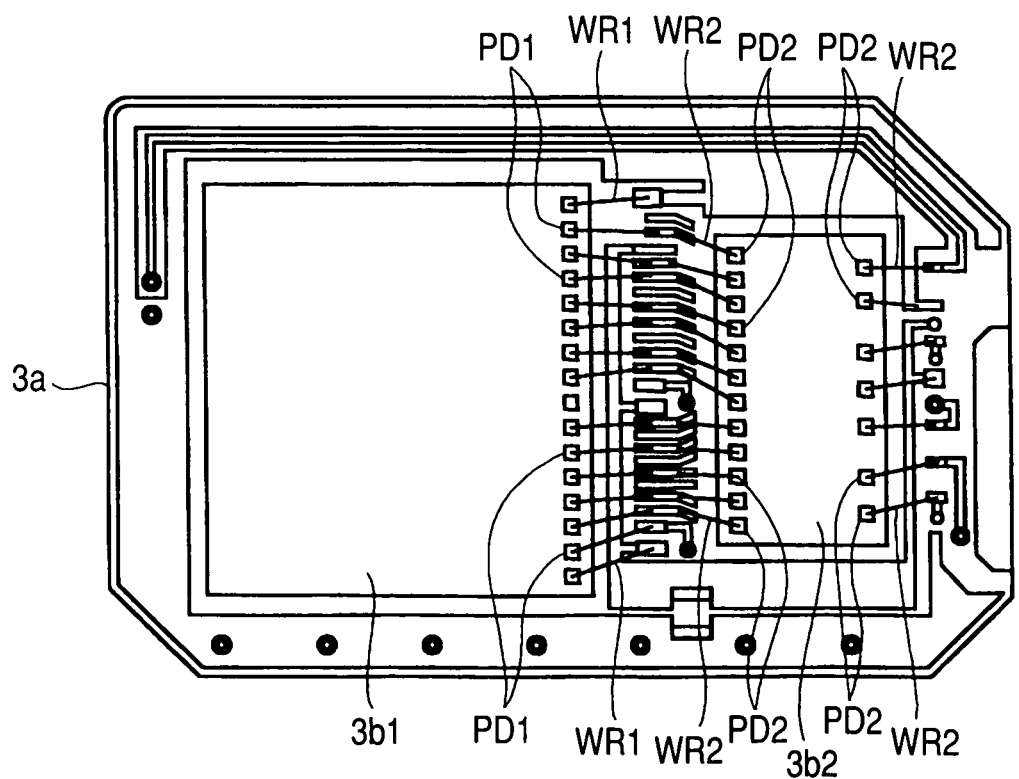
FIG. 8 is an overall plan view of the IC card of FIG. 1 when a sealing part of the principal surface of the IC card body is removed.
Figure 9:
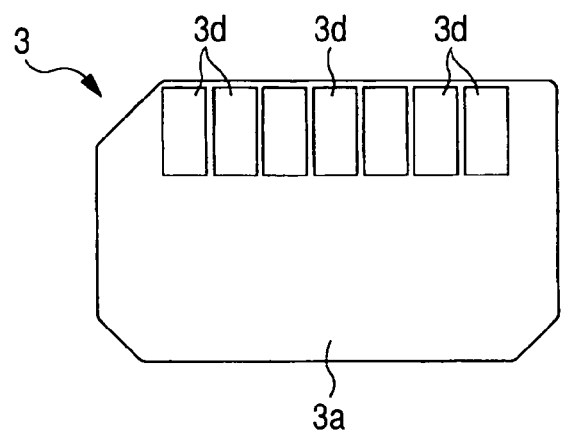
FIG. 9 is an overall plan view showing an example of an array of different terminals on the back surface of the body of the IC card of FIG. 1.

FIG. 1 is an overall perspective view of a memory card (IC card) 1A of the present embodiment when viewed from a principal surface thereof. FIG. 2 is an overall perspective view of the memory card 1A of FIG. 1 when viewed from a back surface thereof. FIG. 3 is an overall plan view of the principal surface of the memory card 1A of FIG. 1. FIG. 4 is an overall plan view of the back surface of the memory card 1A of FIG. 1. FIG. 5 is a sectional view along the line Y1-Y1 of FIG. 4. FIG. 6 is an overall plan view of a memory body of the memory card 1A. FIG. 7 is a sectional view along the line X1-X1 of FIG. 6. FIG. 8 is an overall plan view of the memory card when a sealing part of the principal surface of the memory body is removed. FIG. 9 is an overall plan view showing an example of an array of different terminals on the back surface of the memory body. The arrow of FIGS. 1 and 3 indicate the direction in which the memory card 1A is inserted into an electronic device.

The memory card 1A of the first embodiment can be used as an auxiliary storage unit of various portable electronic devices including information processing units such as portable computers, image processing units such as digital cameras, or communication devices such as cellular phones. The memory card 1A is formed from a plane rectangular, small thin plate having a chamfered part. Its contour dimensions are about 24 mm in width (second length) W1, about 18 mm in length (first length) L1, and about 1.4 mm in depth D1. The memory card 1A has the same contour specifications and functions as multimedia cards (hereinafter simply referred to as RSMMC) of so-called reduced size. The contour size allows the memory card to be used as, e.g., small-size electronic devices such as cellular phones and digital cameras. However, by converting the memory card into a full-size MMC (hereinafter simply referred to as FSMMC) using an adapter (auxiliary instrument), the memory card can also be used for relatively large-size electronic devices such as portable personal computers.

A sheet metal cap 2 forming the appearance of the memory card 1A is formed of an insulating resin such as ABS resin and PPE (Poly Phenylen Ether) in terms of weight reduction, machinability, and flexibility. To improve mechanical strength, a glass-reinforced fiber having higher tensile strength per sectional area than the above-mentioned insulating resin forming the cap 2 is mixed into the resin. A chamfered part 2a at one corner at the front side of the cap 2 is used for index. A small recess (second recess) 2b formed on a short side of the cap 2 on the side of the chamfered part 2a is provided to realize a latch mechanism for holding the memory card 1A in an electronic device to prevent the memory card 1A incorporated in the electronic device from being forcibly extracted, or prevent the memory card 1A from popping out when the electronic device is dropped. The length L2 of the recess 2b is about 1.5±0.1 mm, and the length L3 is about 0.55±0.1 mm. The recess 2b, when viewed from a side thereof, is formed to terminate in the middle of thickness of the cap 2 from the principal surface (first surface), so that its depth is about 0.65±0.1 mm. Although the recess 2b can be provided at plural locations, when too many recesses 2b were provided, the mechanical strength of the cap 2 would decrease. Therefore, in the first embodiment, the recess 2b is provided only at the side of one side of the memory card 1A. Thereby, the mechanical strength of the cap 2 can be maintained. For RSMMC, since the length L1 of the memory card 1A in the direction of the arrow A is shorter than the width W1 orthogonal to it, and the length of a card guide of a connector to which the memory card 1A is attached becomes short, when a connector for pressing the sides of the memory card 1A is used, the memory card 1A is liable to disconnect from the connector due to rotary deviation (rotation direction within a surface parallel to the principal surface of the memory card 1A). Accordingly, in that case, the recess 2b may be provided at each of sides opposite to each other of the cap 2. Since rotary deviation can be prevented by this construction, the ability to prevent the memory card 1A from falling off can be increased. The recess 2b will be described in detail later. Adapter attaching parts 2c having a convex cross section at both corners at the back of the cap 2 are fitted into recesses of the adapter for converting RSMMC into FSMMC. An adapter claw attaching part 2d at the center in a longitudinal direction in the vicinity of the back of the back surface of the cap 2 is engaged with a claw of the adapter. A plane triangular mark 2e at the front side of the principal surface of the cap 2 indicates the direction in which the memory card 1A is inserted into a desired electronic device. An indentation 2f is used to stick a seal capable of describing various information (classification of the memory card 1A, etc.). A groove 2g is a groove for removing the card.

On the back surface of the cap 2 (second surface, part housing surface), a recess 2h (first recess) is formed. The recess 2h is formed in stepped form with a shallow recess 2h1 and a deep recess 2h2. In the outer circumference of the recess 2h, a frame part 2i is formed so as not to compromise its continuity along the direction of the outer circumference. By the frame part 2i, the mechanical strength of the thin cap 2 is maintained. Both corners of the recess 2h at the back of the cap 2 are chamfered and the width of the frame part 2i1 in those portions is expanded to enhance the mechanical strength of the cap 2. A memory body 3 (electronic part body) is fitted in and bonded to or placed into tight contact with the recess 2h. The memory body 3 includes a wiring board 3a, semiconductor chips (hereinafter simply referred to as chips) 3b (3b1, 3b2) mounted on a principal surface of the wiring board 3a, and a sealing part 3c for sealing the chips 3b. The wiring board 3a of the memory body 3 has a wiring structure in which one or plural metal wiring layers (wiring) are formed in an insulator such as resins of a glass epoxy system. The wiring for the principal surface of the wiring board 3a is electrically connected with external terminals 3d of the back surface of the wiring board 3a via through holes. In FIGS. 2 and 4, e.g., 13 external terminals 3d are arrayed along the longitudinal direction of the wiring board 3a. In another case, as shown in FIG. 9, e.g., seven external terminals may be arrayed in a row along the longitudinal direction of the wiring board 3a. The plane contour of the wiring board 3a is formed to be rectangular, and its three corners are chamfered.

On the principal surface of the wiring board 3a (chip mounting surface), two chips 3b1 and 3b2 different in plane size are mounted with their principal surfaces (device forming surfaces) upward and their back surfaces bonded to the wiring board 3a by an adhesive or the like. The two chips 3b1 and 3b2 are disposed in line along the longitudinal direction of the wiring board 3a (that is, the disposition direction of the plural external terminals 3d). On the chip 3b1 having a relatively large plane size, a flash memory (EEPROM: Electrically Erasable Programmable Read Only Memory) having a memory capacity of 16 M bytes (128M bits), 32 M bytes (256M bits), or 64 M bytes (512M bits) is formed. Of course, plural memory chips 3b1 may be arrayed on the principal surface of the wiring board 3a to obtain a desired memory capacity in total. Also, the chips may be stacked in layers to obtain a desired memory capacity in total. When the chips are stacked in layers, a large capacity can be obtained on a small occupation area. The chip 3b1 is disposed at a position distant from the chamfered part for index. In the vicinity of one side of a principal surface of the memory chip 3b1, plural pointing pads (hereinafter referred to as pads) PD1 are disposed along the side. The pads PD1 are electrically connected with the wiring of the principal surface of the wiring board 3a through bonding wires WR1. The bonding wires WR1 are formed of metallic thin wires such as gold (Au). On the other hand, on the chip 3b2 having a relatively small plane size, a controller is formed which controls the operation of a flash memory circuit of the chip 3b1. The chip 3b2 is disposed near the chamfered part for index. On the principal surface of the chip 3b2 for the controller, in the vicinity of two opposite long sides, plural pads PD2 are disposed in a row along each of the long sides. The pads PD2 are electrically connected with the wiring of the principal surface of the wiring board 3a through bonding wires WR2.

The chips 3b1 and 3b2, the bonding wires WR1 and WR2, and most of the principal surface of the wiring board 3a are covered by the sealing part 3c made of resin and the like of epoxy system. The sealing part 3c is housed in the deep recess 2h2 side of the cap 2, and an outer circumferential portion of the principal surface of the wiring board 3a exposed from the sealing part 3c contacts the upper surface of a stepped portion of the shallow recess 2h1 of the cap 2 and is bonded by an adhesive.

Figure 10:
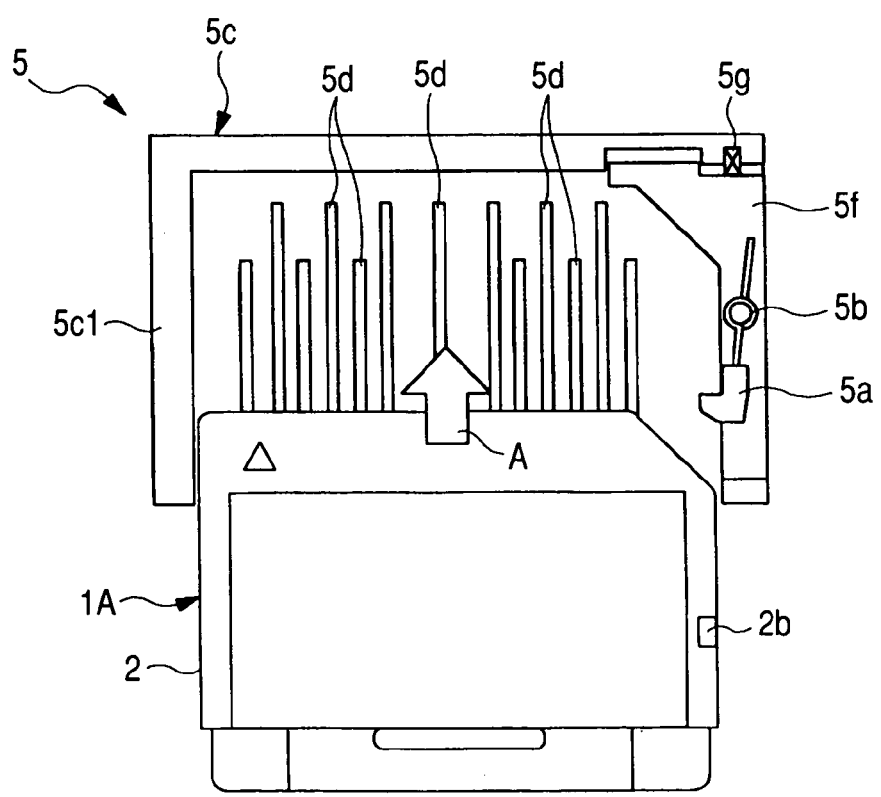
FIG. 10 is a drawing for explaining the IC card of FIG. 1 before being attached to a connector.
Figure 11:
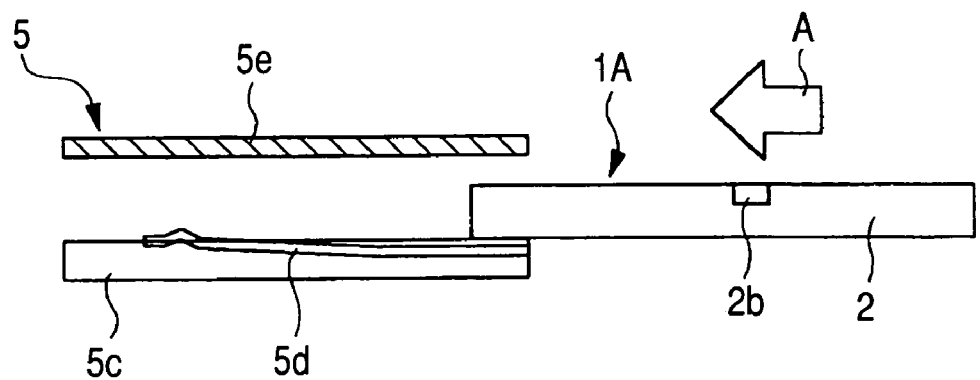
FIG. 11 is a drawing for explaining the IC card of FIG. 10 when viewed from a right side thereof.
Figure 12:
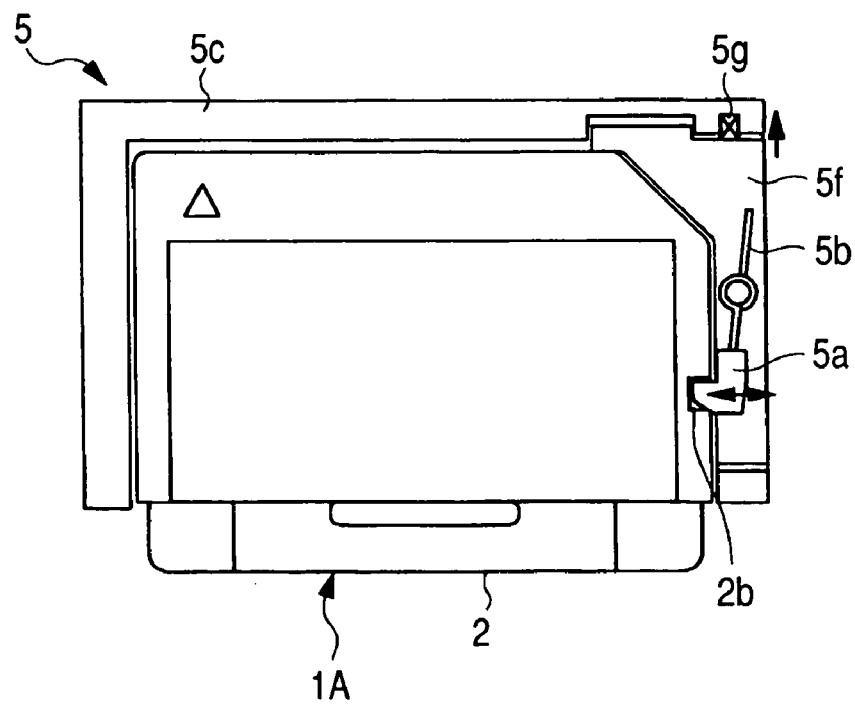
FIG. 12 is a drawing for explaining the IC card of FIG. 1 after being attached to the connector.
Figure 13:
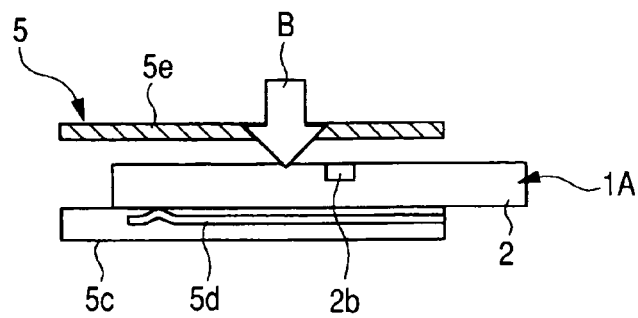
FIG. 13 is a drawing for explaining the IC card of FIG. 12 when viewed from a right side thereof.

Next, with reference to FIGS. 10 to 13, a description will be made of how the memory card 1A is attached to a connector of an electronic device. FIG. 10 shows the memory card 1A before being attached to the connector 5. FIG. 11 shows the memory card 1A of FIG. 10 when viewed from a right side thereof. FIG. 12 shows the memory card 1A after being attached to the connector 5. FIG. 13 is a right side view of FIG. 12.

When the memory card 1A is inserted into the connector 5 along the direction of the arrow A, the tip of the lock claw 5a of the connector 5 enters the recess 2b at a side of the memory card 1A. A coil spring 5b is attached to another end of the lock claw 5a, and the lock claw 5a is urged in the direction of the side of the memory card 1A. This prevents the memory card 1A from falling off the connector 5. That is, since the memory card 1A can be firmly supported by the lock claw 5a of the connector 5 by providing the memory card 1A with the recess 2b, the memory card 1A can be prevented from falling off the connector 5.

When the memory card 1A is inserted into the connector 5, the tips of 13 metallic contact pins 5d attached to a connector body 5c contact the external terminals 3d of the memory card 1A. The contact pins 5d are formed in the shape of flat springs, and their tips are urged to the back surface of the memory card 1. Thereby, the tips of the contact pins 5d tightly contact the external terminals 3d. An metallic upper shell 5e of the connector 5 is provided with an elastic claw integrated with it, and by the elasticity claw, the memory card 1A is urged in a direction indicated by the arrow B of FIG. 13. Thereby, since the memory card 1A is pressed against the contact pins 5d when inserted into the connector, the tips of the contact pins 5d tightly contact the external terminals 3d. This construction brings the contact pins 5d of the connector 5 into a satisfactory electrical connection with the external terminals 3d of the memory card 1A.

When the memory card 1A has been inserted into the connector 5, a slider 5f of connector 5 is slid in the direction of the arrow A by the memory card 1A and the memory card 1A is locked. As a method of ejecting the memory card 1A, e.g., a push-push system is adopted. Specifically, when the back of the memory card 1A inserted into the connector 5 is lightly pushed in the direction of the arrow A, the memory card 1A is unlocked and lightly pops out backward by an urging force of a coil spring 5g, so that the memory card 1A can be easily removed from the connector 5.

Next, a description will be made of the recess 2b for preventing the memory card 1A from falling off.

Figure 14:
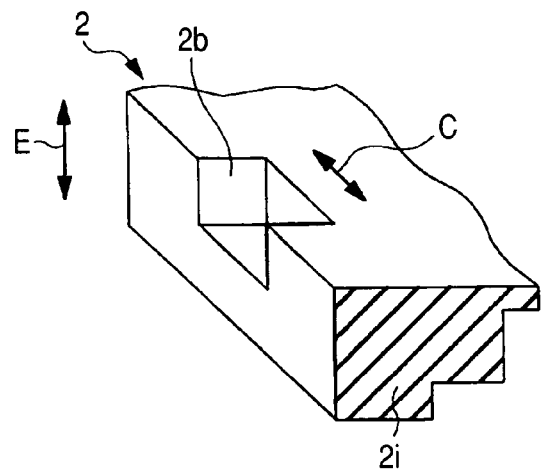
FIG. 14 is a perspective view showing major parts of the cap when the recess of the IC card of FIG. 1 is viewed from the principal surface of the cap.
Figure 15:
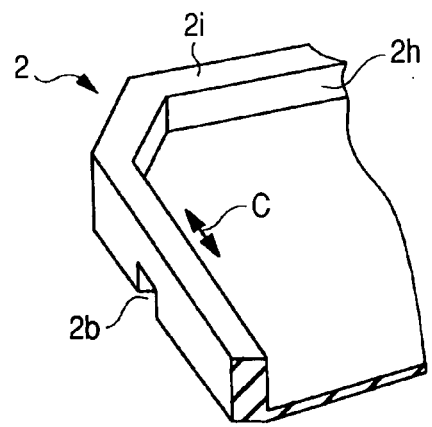
FIG. 15 is a perspective view showing major parts of the cap when the recess of the IC card of FIG. 1 is viewed from the back surface of the cap.
Figure 16:
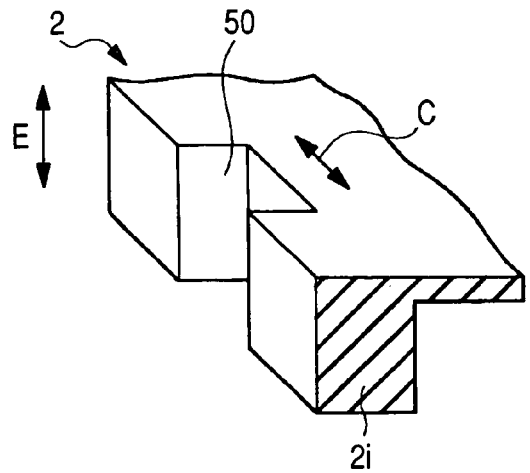
FIG. 16, which is shown for comparison, is a perspective view showing major parts of the cap on the principal surface when the recess for preventing the IC card from falling off penetrates from the principal surface to the back surface of the cap.
Figure 17:
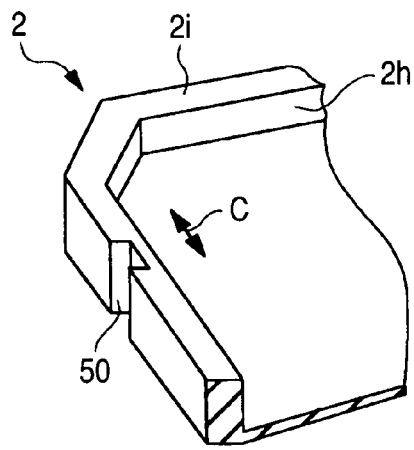
FIG. 17, which is shown for comparison, is a perspective view showing major parts of the cap on the back surface when the recess for preventing the IC card from falling off penetrates from the principal surface to the back surface of the cap.

FIG. 14 is a perspective view showing major parts of the cap 2 when the recess 2b of the memory card 1A is viewed from the principal surface of the cap 2. FIG. 15 is a perspective view showing major parts of the cap 2 when the recess 2b of the memory card 1A is viewed from the back surface of the cap 2. FIGS. 16 and 17, which are shown for comparison, are perspective views showing major parts of the cap 2 on the principal surface and the back surface when the recesses 50 for preventing the memory card from falling off penetrate from the principal surface to the back surface of the cap 2.

As shown in FIGS. 14 and 15, in the first embodiment, the recess 2b does not penetrate from the principal surface to the back surface of the cap 2, a resin part of cap 2 is left at the bottom of the recess 2b, and the continuity of the frame part 2i of the back surface of the cap 2 is maintained. Thereby, the mechanical strength of the cap 2 can be maintained. Specifically, as shown in FIGS. 16 and 17, when the recess 50 for preventing the memory card from falling off penetrates from the principal surface to the back surface of the cap 2, the frame part 2i of the back surface of the cap 2 maintaining the mechanical strength of the thin cap 2 becomes thin partially and its continuity is compromised, with the result that the mechanical strength of the cap 2 decreases. In contrast to this, in the first embodiment, since a resin part of the cap 2 is left at the bottom of the recess 2b, and the recess 2b does not compromise the continuity of the frame part 2i of the back surface of the cap 2 so that the continuity of the frame part 21 is maintained. By this construction, the mechanical strength of the cap 2 can be maintained even when the recess 2b for falling-off prevention is provided in the thin cap 2.

As shown in FIGS. 14 and 15, in the first embodiment, the recess 2b is formed on the principal surface of the cap 2 and does not penetrate from the principal surface to the back surface of the cap 2. Therefore, according to the first embodiment, the memory card 1A can be prevented from moving in a memory card 1A attaching/detaching direction indicated by the arrow C of the memory card 1A, and also from moving in the thickness direction of the memory card 1A indicated by the arrow E. Specifically, since the memory card 1A inserted into the connector 5 is thin, it may shake in the direction of the arrow E because of external shocks. As shown in FIGS. 16 and 17, when the recess 50 for preventing the memory card from falling off penetrates from the principal surface to the back surface of the cap 2, since there is no part to prevent the memory card from moving in the direction of the arrow E, the memory card cannot be prevented from shaking, and the external terminals 3d of the memory card and the contact pins 5d of the connector may disconnect momentarily. To prevent this problem, it is conceivable to provide a member for preventing shakes in the thickness direction of the memory card. In this case, however, there is a problem in that the number of parts increases and the connector cost is increased. Also, the connector 5 tends to be more compact and lighter in weight, and therefore it is difficult to provide new parts and mechanisms. In contrast to this, in the first embodiment, a resin part of the cap 2 is left at the bottom of the recess 2b and there can be provided a part to prevent the memory card 1A from moving in the direction of the arrow E. By this construction, the memory card 1A in the connector 5 can be prevented from shaking in the direction of the arrow E, and a momentary poor connection between the external terminals 3d of the memory card 1A and the contact pins 5d of the connector 5 can be prevented. Since a mechanical part for falling-off prevention of the memory card 1A also serves as a mechanism for preventing the memory card 1A from shaking, new parts and mechanisms do not need to be added. Therefore, the memory card of this embodiment will neither cause an increase in costs of the connector 5 nor hamper the trend to make the connector 5 more compact and lighter in weight.

Figure 18:
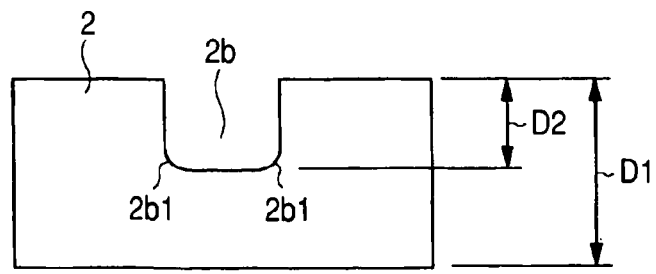
FIG. 18 is a side view showing major parts of the cap of the IC card of FIG. 1.
Figure 19:
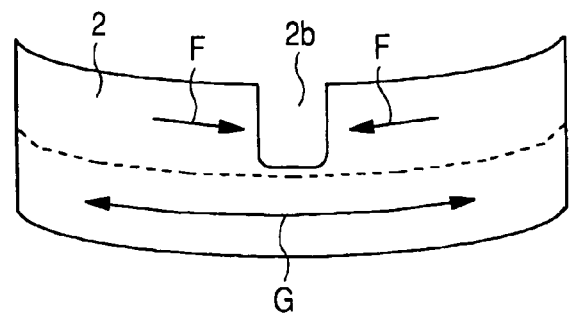
FIG. 19 is a drawing for explaining the depth of the recess of FIG. 18.
Figure 20:
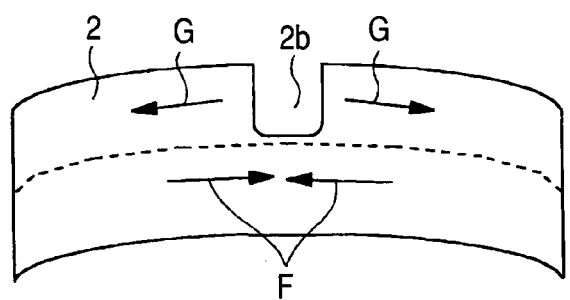
FIG. 20 is a drawing for explaining the depth of the recess of FIG. 18.

FIG. 18 is a side view showing major parts of the cap 2. FIGS. 19 and 20 respectively show the depth of the recess 2b. As shown in FIG. 18, the depth D2 of the recess 2b is about a third to two thirds of the thickness D1 of the cap 2, preferably about two fifths to three fifths, more preferably half the thickness of the cap 2. Half the thickness of the cap 2 referred to here is not only the actual half 0.7 mm but also includes a range of error. That is, when a range of error is e.g., ±0.1 mm, half the thickness of the cap 2 referred to here is 0.6 to 0.8 mm. The reason for this is that, as shown in FIGS. 19 and 20, when the cap 2 is bent, since a neutral plane of a compressive stress F and a tensile stress G occurs at a location half the thickness of the cap 2, by forming the bottom of the recess 2b in the neutral plane position or its vicinity, the bottom of the recess 2b can be less affected by the compressive stress and the tensile stress. As a result, according to the first embodiment, cracks can be inhibited or prevented from occurring at both corners 2b1 of the bottom of the recess 2b due to the bend stress of the cap 2. In the first embodiment, round tapers are formed at both corners 2b1 of the bottom of the recess 2b. By this construction, since stress applied to the both corners 2b1 at the bottom of the recess 2b can be dispersed, cracks can be further inhibited or prevented from occurring at both corners 2b1 of the bottom of the recess 2b due to the bend stress of the cap 2. Accordingly, the mechanical strength of the cap 2 can be maintained even when the recess 2b for falling-off prevention is provided in the thin cap 2.

Figure 21:
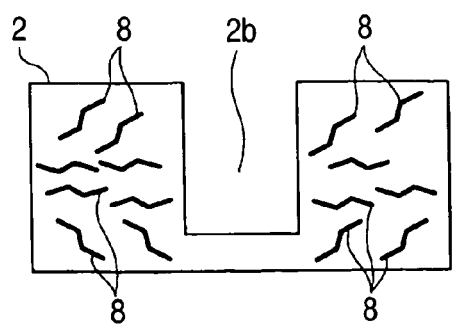
FIG. 21 is a drawing schematically showing glass-reinforced fibers on the side of the cap of the IC card.
Figure 22:
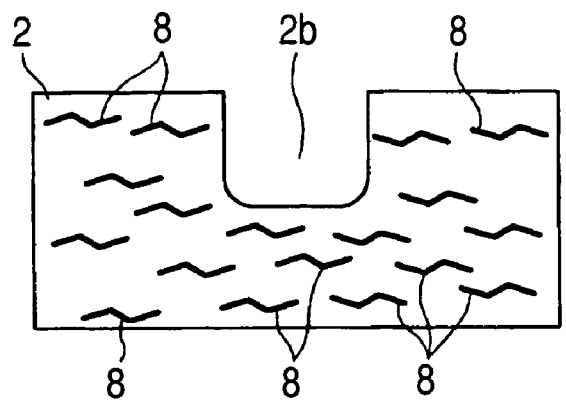
FIG. 22 is a drawing schematically showing glass-reinforced fibers on the side of the cap of the IC card of FIG. 1.
Figure 23:
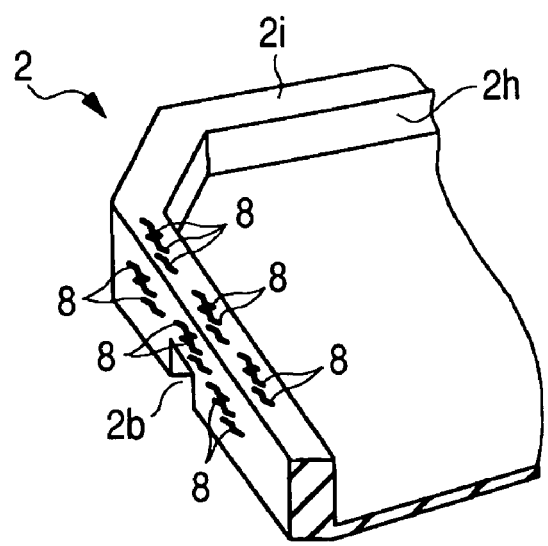
FIG. 23 is a drawing schematically showing glass-reinforced fibers on the back surface of the cap of the IC card of FIG. 1.

FIG. 21 schematically shows glass-reinforced fibers 8 on the side of the cap 2. When the recess 2b is too deep, the orientation of the glass-reinforced fibers 8 falls into disorder, so that the mechanical strength of the cap 2 may be lost. Accordingly, in the first embodiment, as shown in FIGS. 22 and 23, the depths of the recess 2b is designed so as not to heavily disorder the orientation of the glass-reinforced fiber 8 contained in the cap 2. Specifically, among the glass-reinforced fibers 8 contained under the recess 2b of the cap 2 (especially the frame part 2i), more glass-reinforced fibers 8 are oriented along the longitudinal direction of the frame part 2i than along other directions. By this construction, the mechanical strength of the frame part 2i of the cap 2 can be enhanced, and the mechanical strength of the cap 2 (rigidity to bending and twisting) can be enhanced. To form such a construction, the depth of the recess 2b has only to be set so that a resin having a thickness of 0.15 mm or longer, preferably 0.2 mm or longer, is left at the bottom of the recess 2b.

Figure 24:
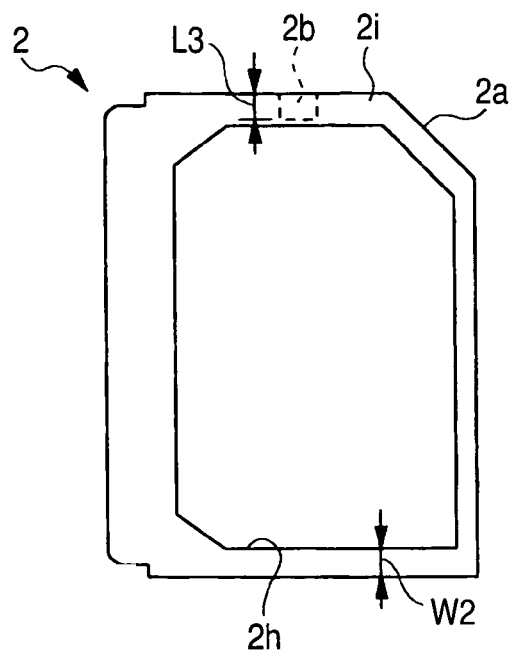
FIG. 24 is an overall plan view of the back surface of the cap of the IC card of FIG. 1.
Figure 25:
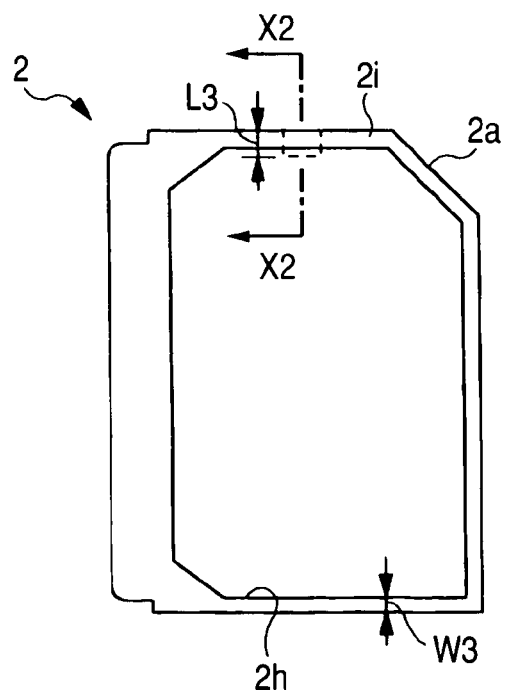
FIG. 25 is an overall plan view of the back surface of the cap of the IC card of FIG. 1.
Figure 26:
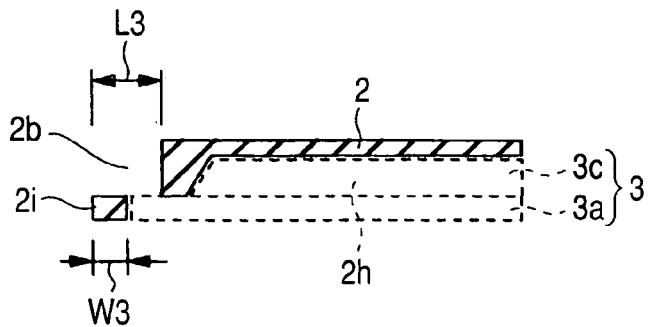
FIG. 26 is a sectional view along the line X2-X2 of FIG. 25 for explaining a defect in forming a recess for preventing an IC card from falling off.
Figure 27:
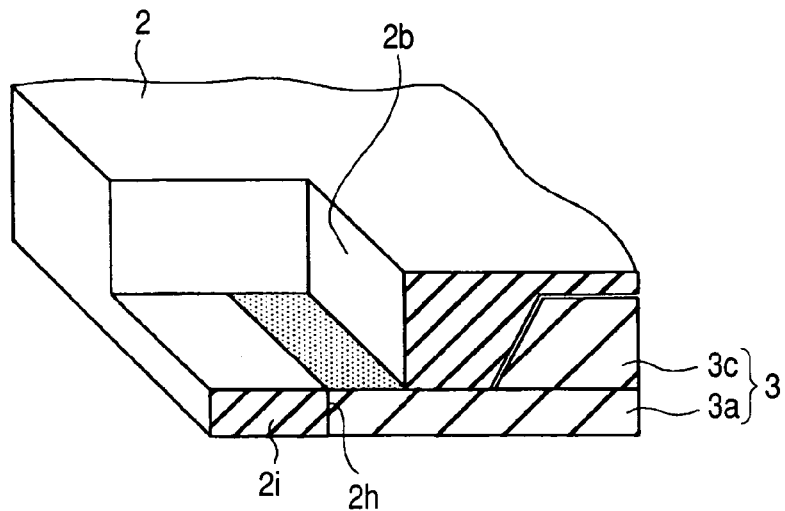
FIG. 27 is a perspective view showing major parts of the recess of the cap of FIG. 26.

FIGS. 24 and 25 show overall plan views of the back surface of the cap 2. In the first embodiment, as shown in FIG. 24, the recess 2b is formed so that its depth length L3 is smaller than the width w2 of the frame part 2i. In this case, the width W2 of the frame part 2i is about 0.6±0.1 mm, for example. However, depending on products, performance improvement and an increase in chip size force the plane area of the wiring board 3a to be expanded, so that, in some cases, the width of frame part 2i may be decreased accordingly. On the other hand, the depth length L3 of the recess 2b must be about 0.5 to 0.6 mm to maintain the ability to prevent the memory card 1A from falling off. As a result, as shown in FIG. 25, the depth length L3 of the recess 2b becomes greater than the width W3 of the frame part 2i, and part of the recess 2b overlaps an area of the recess 2h. When the recess 2b is thus made too deep on the condition that depth length L3>width W3, as shown in FIGS. 26 and 27, the recess 2b will penetrate the recess 2h, and a part (a coating side of an adhesive) of the principal surface (chip mounting surface) of the wiring board 3a will be exposed. The depth length L3 of the recess 2b should be preferably long to enhance the ability to prevent the memory card 1A from falling off. However, when the recess 2b is excessively extended to the right direction of FIG. 26, the recess 2b will penetrate the recess 2h at a side of the recess 2b. FIG. 26 is a sectional view along the line X2-X2 of FIG. 25. FIG. 27 is a perspective view showing major parts of the recess 2b of the cap 2 of FIG. 26.

Figure 28:
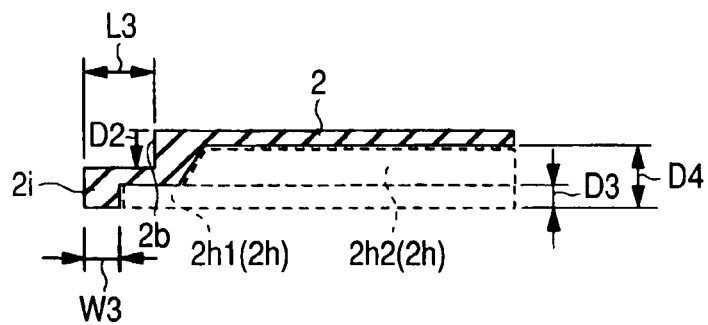
FIG. 28 is a sectional view taken along the line X2-X2 of FIG. 25 of the cap of the IC card of FIG. 1.

Accordingly, in the first embodiment, as shown in FIG. 28, when depth length L3>width W3, the depth D2 of the recess 2b is set so that the recess 2b does not penetrate the recess 2h. The recess 2h is provided with the shallow recess 2h1 and the deep recess 2h2, and the recess 2b overlaps an area of the shallow recess 2h1 to secure a resin thickness between the recess 2b and the deep recess 2h2. This prevents the recess 2b from penetrating the recess 2h at its bottom and side. FIG. 28 is a sectional view taken along the line X2-X2 of FIG. 25 in the case of the first embodiment. The shallow recess 2h1, whose depth D3 is about 0.4 mm, is used to house the wiring board 3a of the memory body 3. The deep recess 2h2, whose depth D4 is about 1 mm, is used to house the sealing part 3c of the memory body 3.

Figure 29:
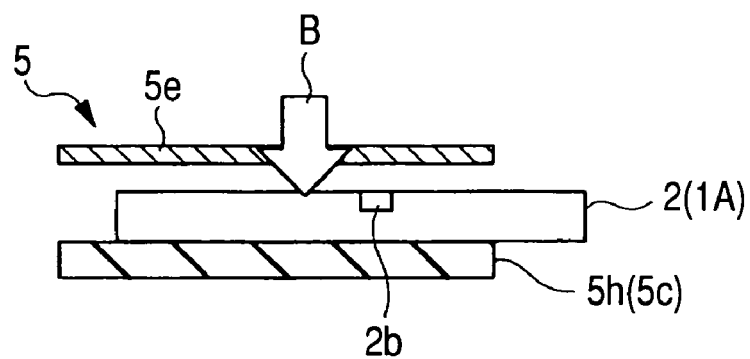
FIG. 29 is a drawing showing a side of the IC card of FIG. 1 when attached to the connector.
Figure 30:
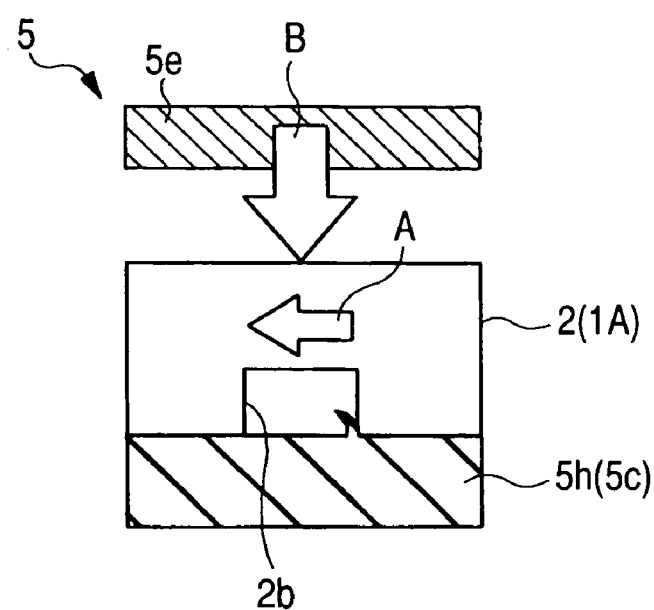
FIG. 30 is a drawing for explaining a defect in forming a recess for preventing an IC card from falling off, on a back surface of the cap.

FIG. 29 shows a side of the memory card 1A when attached to or detached from the connector 5. FIG. 30 enlargedly shows a contact portion between the cap 2 and a guide part when the recess 2b exists on the back surface of the cap 2 of the memory card 1A. As described above, when the memory card 1A is attached or detached, it is slid in the horizontal direction of FIG. 29 with pressure applied to the memory card 1A in the direction of the arrow B so that the external terminals 3d of the memory card 1A, and the contact pins 5d of the connector 5 are brought into a satisfactory contact with each other. As a result, the back surface on the outer circumference side of the memory card 1A is pressed against a guide part 5h of a plastic connector body 5c of the connector 5, and both members are slid in the horizontal direction of FIG. 29 while rubbing against each other. As a result, as shown in FIG. 30, when the recess 2b is provided on the back surface of the cap 2, both the cap 2 and the guide part 5h may be damaged, such as the upper surface of the guide part 5h that is shaved by the recess 2b. Especially, for RSMMC, since the short sides of the card compel the whole area of the back surface at the sides to be used as the guide part of the card, when the recess 2b is provided on the back surface of the cap 2, the recess 2b will contact the guide part 5h of the connector 5 without fail. In contrast to this, in the first embodiment, by providing the recess 2b on the principal surface of the cap 2, since the smoothness of the back surface of the cap 2 is maintained, damages due to contact between the cap 2 and the guide part 5h when the memory card 1A is attached or detached can be reduced. Therefore, the life of the memory card 1A and the connector 5 can be extended.

Figure 31:
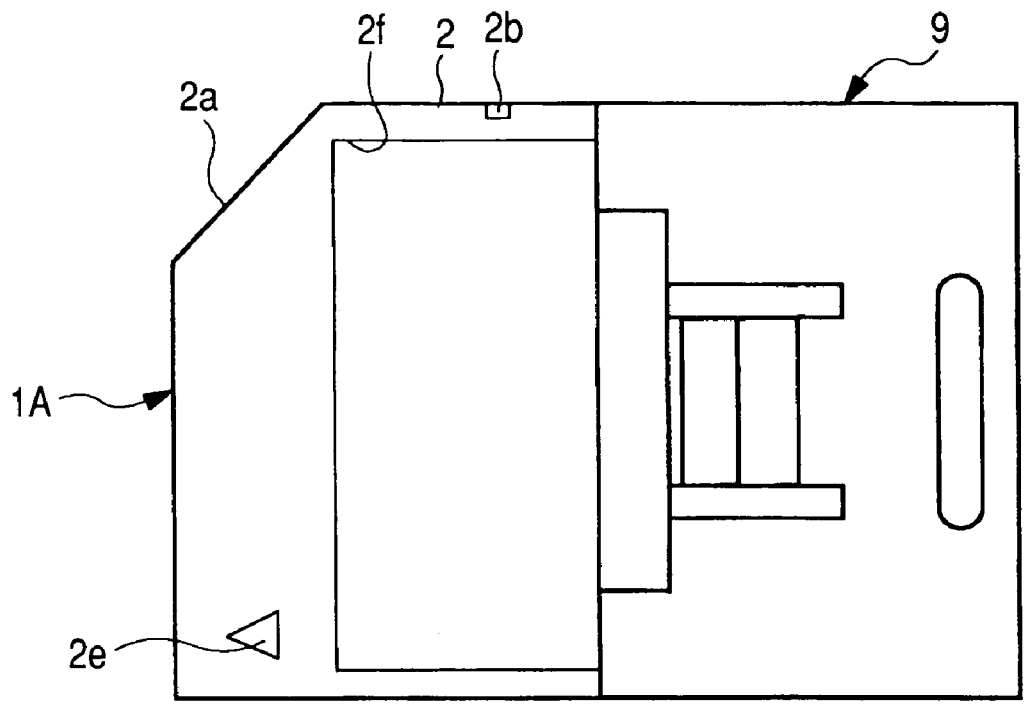
FIG. 31 is a plan view of the principal side of the IC card of FIG. 1 when an adapter is attached to the IC card.
Figure 32:
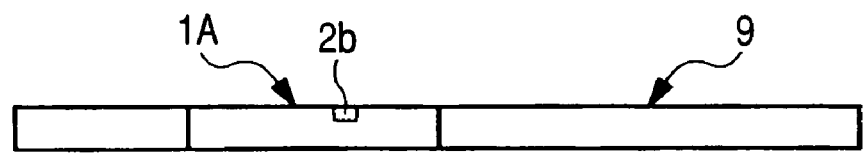
FIG. 32 is a side view of the IC card of FIG. 31.
Figure 33:
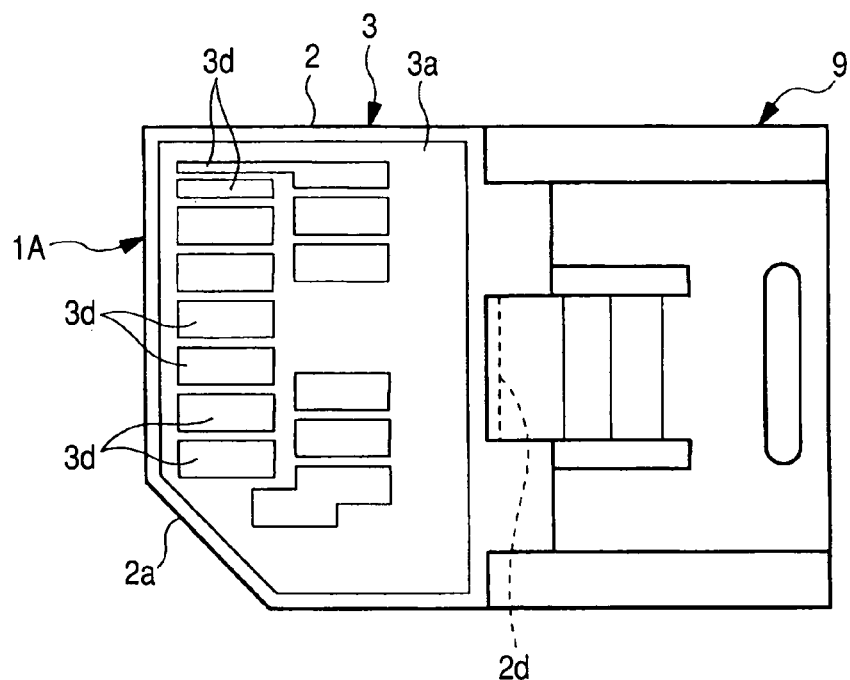
FIG. 33 is a plan view of the back surface of the IC card of FIG. 31.

FIG. 31 is a plan view of the principal side of the memory card 1A when an adapter 9 is attached to the memory card 1A (RSMMC). FIG. 32 is a side view of the memory card 1A of FIG. 31. FIG. 33 is a plan view of the back surface of the memory card 1A of FIG. 31. By attaching the adaptor 9 to the memory card 1A, RSMMC can be converted into FSMMC, that is, FSMMC size (e.g., 32 mm×24 mm×1.4 mm). The recess 2b for falling-off prevention is exposed at one side of the principal surface of the converted memory card 1A, and the converted memory card 1A can also be prevented from falling off and popping out of an electronic device.

Second Embodiment

Figure 34:
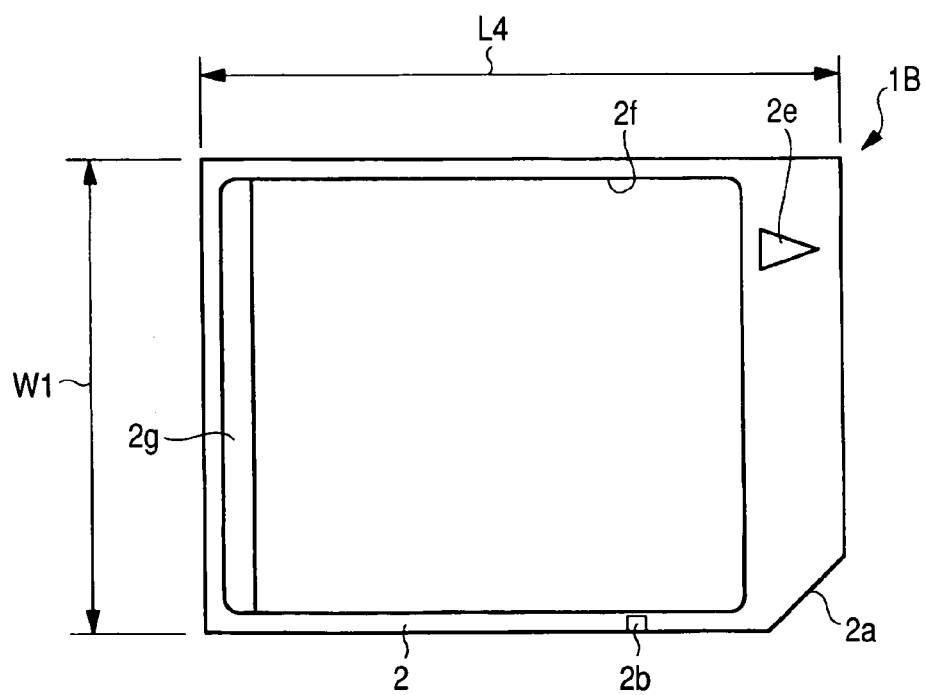
FIG. 34 is an overall plan view of the principal surface of an IC card of another embodiment of the present invention.
Figure 35:
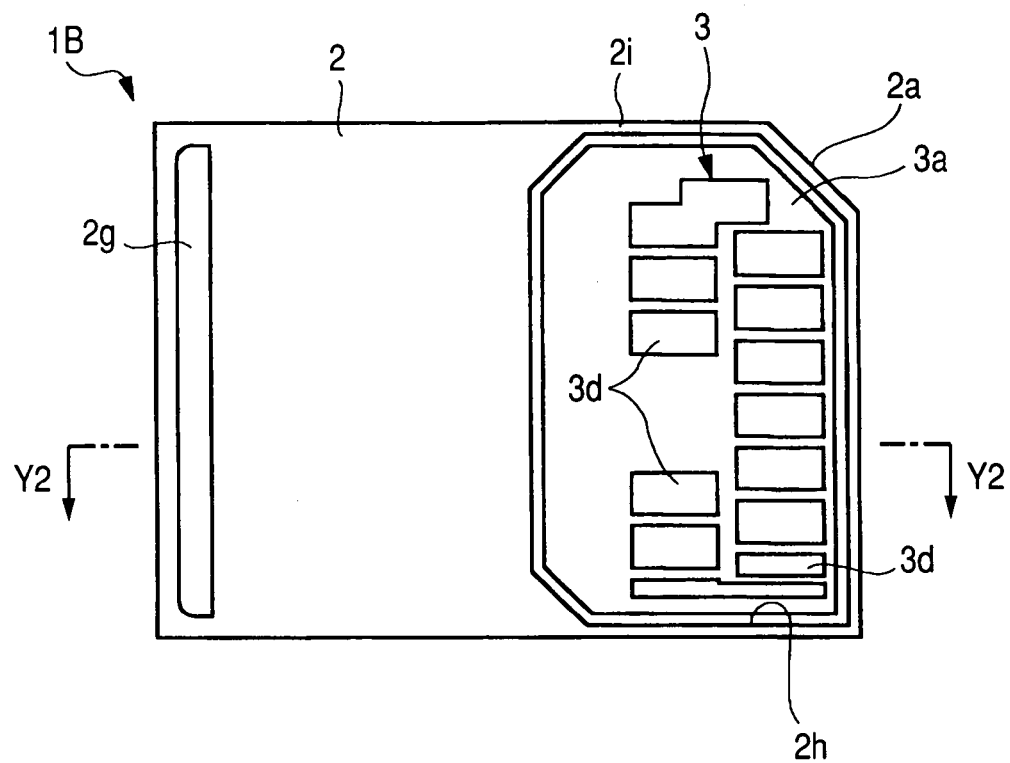
FIG. 35 is an overall plan view of the back surface of the IC card of FIG. 34.
Figure 36:
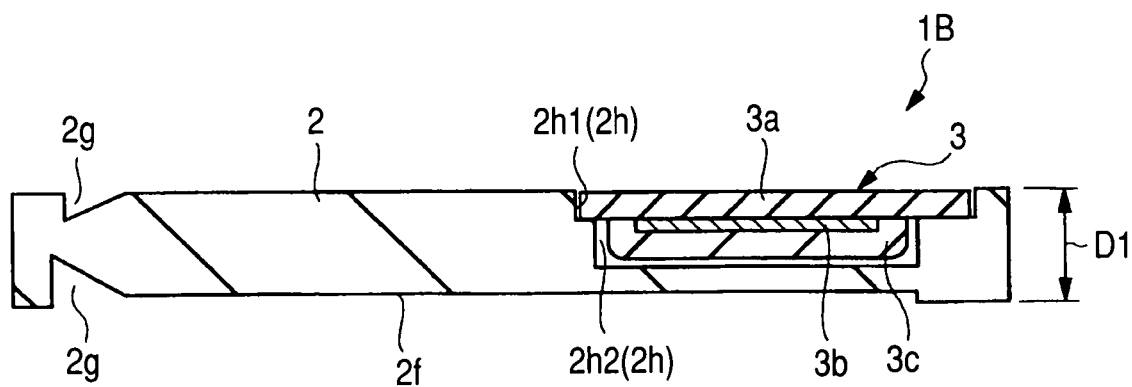
FIG. 36 is a sectional view taken along the line Y2-Y2 of FIG. 35.

In the second embodiment, FSMMC will be described. FIG. 34 is an overall plan view of the principal surface of a memory card 1B of the second embodiment. FIG. 35 is an overall plan view of the back surface of the memory card 1B of FIG. 34. FIG. 36 is a sectional view taken along the line Y2-Y2 of FIG. 35.

The cap 2 of the memory card 1B of the second embodiment is larger in its plane size than the cap 2 of the memory card 1A of the first embodiment, and is, for example, about 32 mm in length L4, about 24 mm in width W1, and 1.4 mm in depth D1. The cap 2 of the memory card 1B does not require a part for attaching an adapter for size conversion. In other points, the memory card 1B is the same as the memory card of the first embodiment.

The memory card 1B of the second embodiment also has the recess 2b formed at the side of one side of the principal surface of the cap 2 as in the first embodiment. This construction enables the memory card 1B to be prevented from falling off and popping out of an electronic device.

Third Embodiment

In the third embodiment, a method of assembling the memory cards 1A and 1B of the first and second embodiments will be described with reference to FIGS. 37 to 41. FIGS. 37 to 41 are plan views of the principal surface of a board frame 10 in the process of assembling the memory cards.

Figure 37:
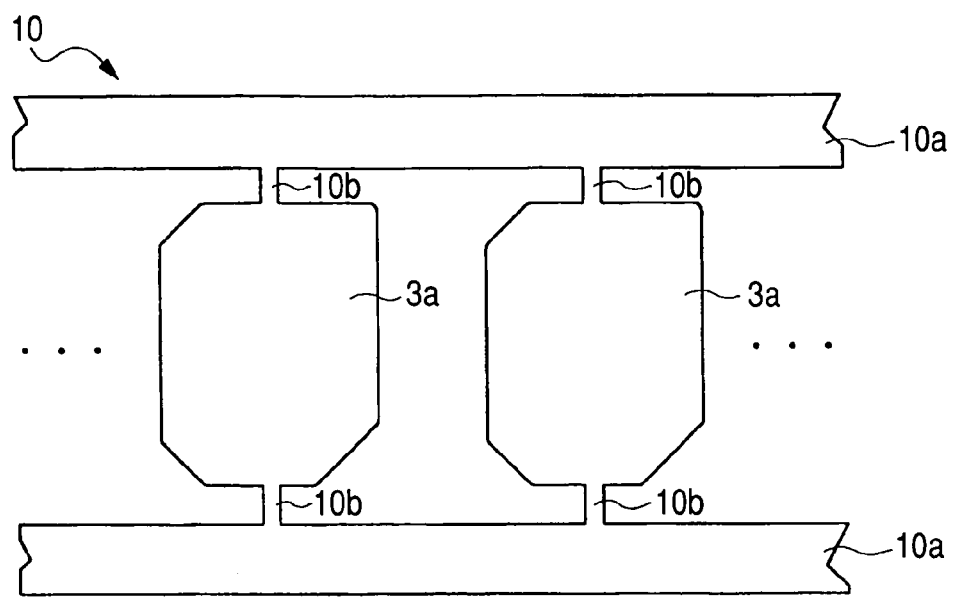
FIG. 37 is a plan view showing major parts of a board frame in the process of assembling IC cards of an embodiment of the present invention.
Figure 38:
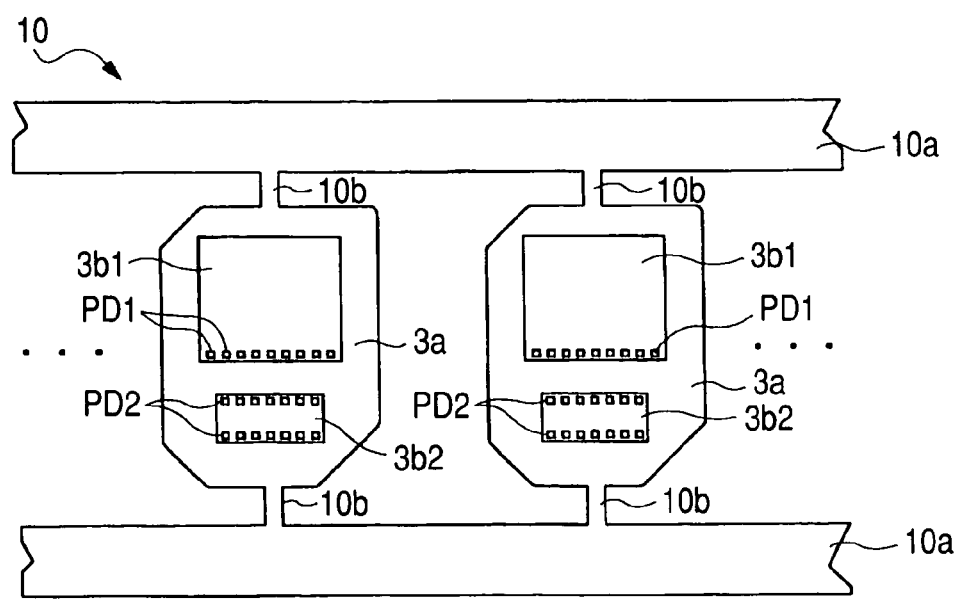
FIG. 38 is a plan view showing major parts of the board frame in the process of assembling IC cards subsequent to FIG. 37.
Figure 39:
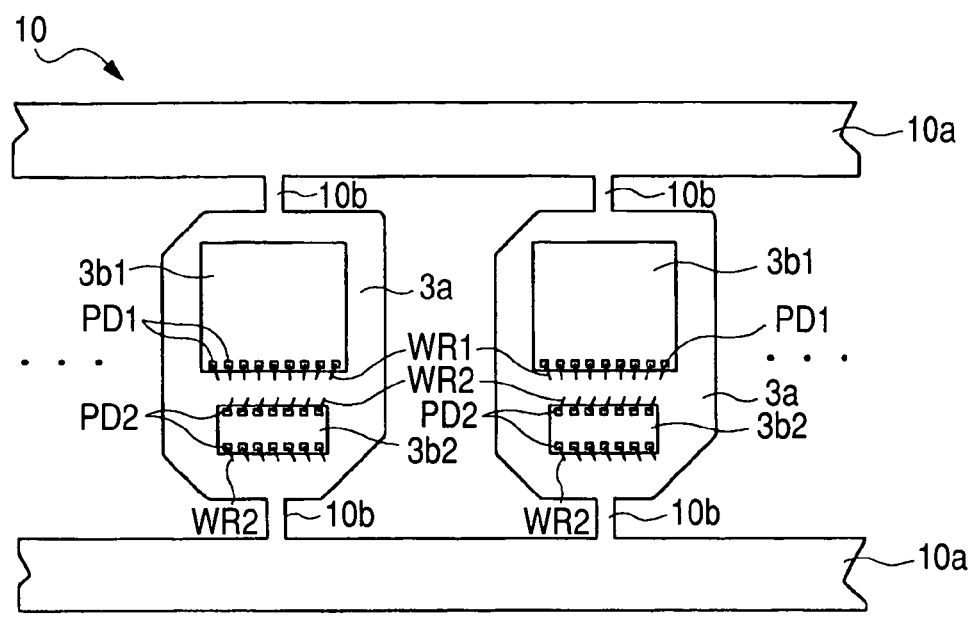
FIG. 39 is a plan view showing major parts of the board frame in the process of assembling IC cards subsequent to FIG. 38.
Figure 40:
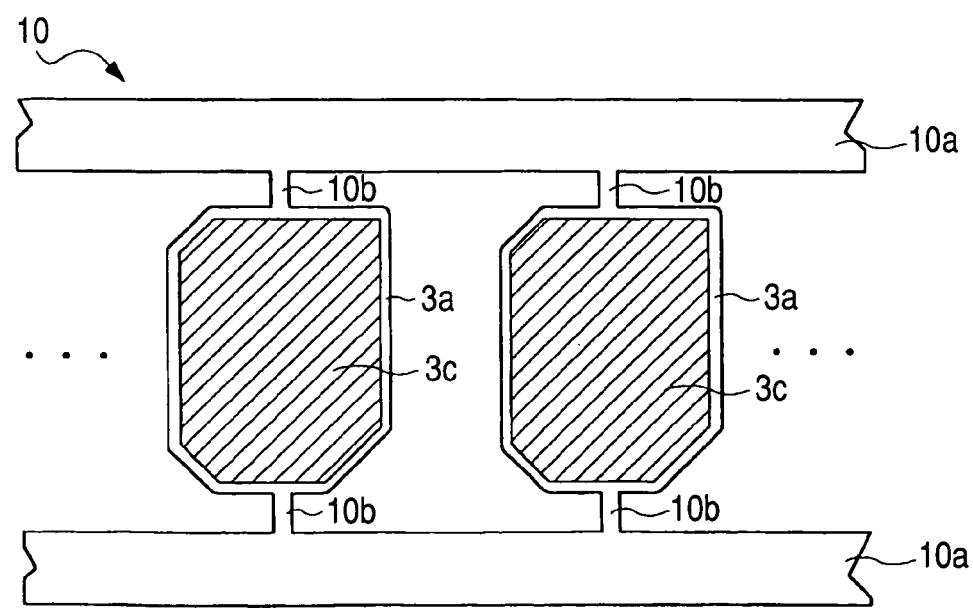
FIG. 40 is a plan view showing major parts of the board frame in the process of assembling IC cards subsequent to FIG. 39.
Figure 41:
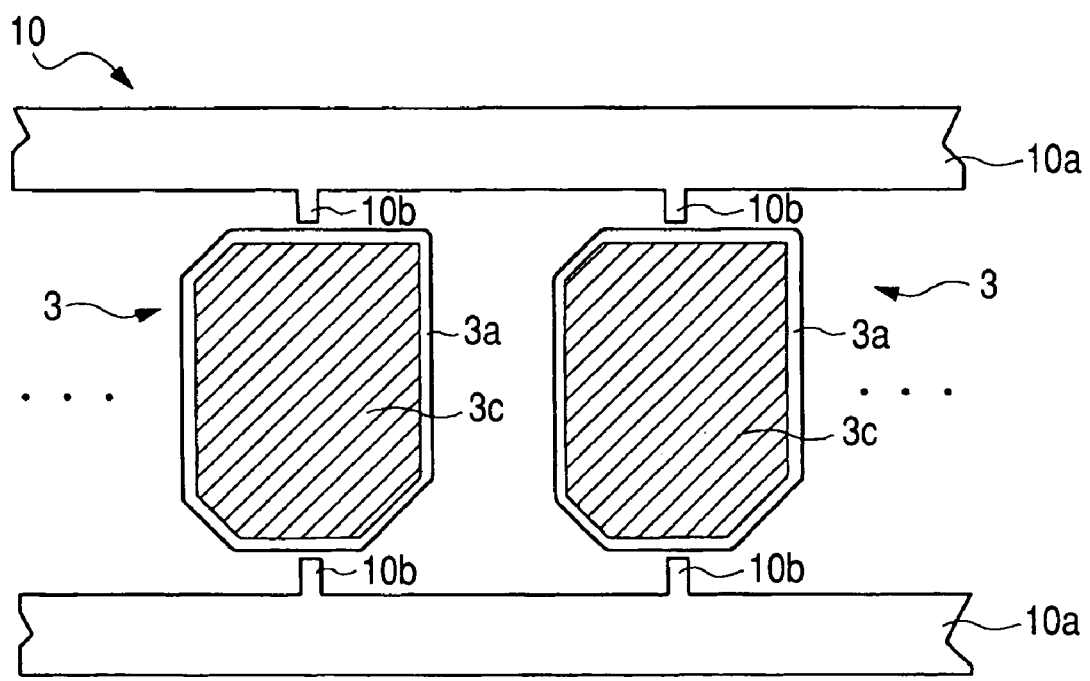
FIG. 41 is a plan view showing major parts of the board frame in the process of assembling IC cards subsequent to FIG. 40.

As shown in FIG. 37, the strap-like board frame 10 is provided. To frame members 10a of the board frame 10, plural wiring boards 3a are connected through fine coupling parts 10b connected to the center of two short sides thereof. In this stage, the frame members 10a, the coupling parts 10b, and the wiring boards 3a are integrally formed. The three corners of the wiring board 3a are chamfered. Next, as shown in FIG. 38, after chips 3b1 and 3b2 are mounted on the principal surface of the each wiring board 3a of the board frame 10, surfaces including wirings and electrodes (pads PD1 and PD2) of the wiring boards 3a and the chips 3b1 and 3b2 are cleaned by e.g., plasma cleaning processing. Then, as shown in FIG. 39, the pads PD1 and PD2 of the chips 3b1 and 3b2 of the each wiring board 3a, and the wiring and electrodes of the wiring board 3a are electrically connected by bonding wires WR1 and WR2. Next, as shown in FIG. 40, the chips 3b1 and 3b2 of the each wiring board 3a of the board frame 10, and the bonding wires WR1 and WR2, and the like are collectively sealed by the transfer molding method, and a sealing part 3c is formed on the each wiring board 3a. Next, as shown in FIG. 41, by cutting the coupling parts 10b, the wiring boards 3a are separated from the board frame 10 to manufacture the memory body 3. Then, when FSMMC is manufactured, the memory body 3 is fitted in the recess 2h of the cap 2 shown by FIGS. 1 to 5 of the first embodiment and fixed by an adhesive. Thus, the memory card 1A of the first embodiment is manufactured. On the other hand, when FSMMC is manufactured, the memory body 3 is fitted in the recess 2h of the cap 2 shown by FIGS. 34 to 36 of the second embodiment and fixed by an adhesive. Thus, the memory card 1B of the second embodiment is manufactured.

Hereinbefore, though the invention made by the inventors has been described in detail based on preferred embodiments, it goes without saying that the present invention is not limited to the preferred embodiments, but may be modified in various ways without changing the main purports of the present invention.

For example, as a method of connecting chips, a connection method using bump electrodes can be adopted.

The above description has been dominated by application of the invention made by the inventors to a memory card incorporating a flash memory (EEPROM), which is an application field of the invention. However, the present invention is not limited to such a memory card; it can also apply to a memory card incorporating another memory circuit such as SRAM (Static Random Access Memory), FRAM (Ferroelectric Random Access Memory), or MRAM (Magnetic Random Access Memory). Also, it can apply to an IC (integrated circuit) card having no memory circuit.

The present invention can apply to the IC card industry.

What is claimed is:

1. An IC card comprising:
a cap having a first surface and a second surface, which is a reverse surface thereof; and an electronic part body that is fitted in and bonded to or placed into tight contact with a first recess of the second surface of the cap,
wherein a second recess for preventing the IC card from falling off or popping out of an electronic device is provided at a side of the cap, the second recess having a depth, in a thickness direction of the cap, of one third to two thirds of the thickness of the cap.

2. The IC card according to claim 1,
wherein the depth of the second recess is two fifths to three fifths of the thickness of the cap.

3. The IC card according to claim 1,
wherein the depth of the second recess is half the thickness of the cap.

4. The IC card according to claim 1,
wherein a first length of the cap in a first direction in which the IC card is inserted into the electronic device is shorter than a second length of the cap in a second direction crossing the first direction.

5. The IC card according to claim 1,
wherein the IC card is a Reduced Size Multi-Media Card (RS-MMC) and the cap has dimensions in plan view satisfying the RS-MMC standard,
wherein the electronic part body comprises a sealing part, a first flash memory chip, and a controller chip for the first flash memory chip, and
wherein the first flash memory chip and the controller chip are sealed by the sealing part.

6. The IC card according to claim 5, further comprising a second flash memory chip,
wherein the second flash memory chip is stacked over the first flash memory chip.

7. The IC card according to claim 5,
wherein a size in plan view of the first flash memory chip is larger than that of the controller chip.

8. The IC card according to claim 1,
wherein the side of the cap in which the second recess is provided is parallel to a first direction in which the IC card is inserted into the electronic device.

9. The IC card according to claim 1, wherein the cap has a first side and a second side parallel to a first direction in which the IC card is inserted into the electronic device, the first side is shorter than the second side, and the second recess is provided in the first side of the cap.

10. The IC card according to claim 1, wherein the cap has a first side and a second side parallel to a first direction in which the IC card is inserted into the electronic device, the second recess is provided in the first side of the cap, and the second side is not provided with a second recess.

11. An IC card comprising:
a cap having a first surface and a second surface, which is a reverse surface thereof; and an electronic part body that is fitted in and bonded to a first recess of the second surface of the cap,
wherein a second recess for preventing the IC card from falling off or popping out of an electronic device is provided on one side of the cap, the second recess having such a depth, in a thickness direction of the cap, that the second recess terminates in an intermediate portion of the thickness of the cap.

12. The IC card according to claim 11,
wherein the depth of the second recess is one third to two thirds of the thickness of the cap.

13. The IC card according to claim 11,
wherein the depth of the second recess is two fifths to three fifths of the thickness of the cap.

14. The IC card according to claim 11,
wherein the IC card is a Reduced Size Multi-Media Card (RS-MMC) and the cap has dimensions in plan view satisfying the RS-MMC standard,
wherein the electronic part body comprises a sealing part, a first flash memory chip, and a controller chip for the first flash memory chip, and
wherein the first flash memory chip and the controller chip are sealed by the sealing part.

15. The IC card according to claim 14, further comprising a second flash memory chip,
wherein the second flash memory chip is stacked over the first flash memory chip.

16. The IC card according to claim 14,
wherein a size in plan view of the first flash memory chip is larger than that of the controller chip.

17. The IC card according to claim 11,
wherein the side of the cap in which the second recess is provided is parallel to a first direction in which the IC card is inserted into the electronic device.

18. The IC card according to claim 11, wherein the cap has a first side and a second side parallel to a first direction in which the IC card is inserted into the electronic device, the first side is shorter than the second side, and the second recess is provided in the first side of the cap.

19. The IC card according to claim 11, wherein the cap has a first side and a second side parallel to a first direction in which the IC card is inserted into the electronic device, second recess is provided in the first side of the cap, and the second side is not provided with a second recess.

20. An IC card comprising:
a cap which has a first surface and a second surface, which is a reverse surface thereof, and is shorter in a first length thereof in a first direction, in which the IC card is inserted into an electronic device, than a second length thereof in a second direction crossing the first direction; and an electronic part body that is fitted in and bonded to or placed in tight contact with a first recess of the second surface of the cap,
wherein a second recess for preventing the IC card from falling off or popping out of an electronic device is provided at a side of the cap, the second recess having such a depth, in a thickness direction of the cap, that the second recess terminates in an intermediate portion of the thickness of the cap.

21. The IC card according to claim 20,
wherein the second recess is provided on one side of the cap.

22. The IC card according to claim 20,
wherein the depth of the second recess is one third to two thirds of the thickness of the cap.

23. The IC card according to claim 20,
wherein the depth of the second recess is two fifths to three fifths of the thickness of the cap.

24. The IC card according to claim 20,
wherein the IC card has dimensions in plan view of 24 mm by 18 mm,
wherein the electronic part body comprises a sealing part, a first flash memory chip, and a controller chip for the first flash memory chip, and
wherein the first flash memory chip and the controller chip are sealed by the sealing part.

25. The IC card according to claim 24, further comprising a second flash memory chip,
wherein the second flash memory chip is stacked over the first flash memory chip.

26. The IC card according to claim 24,
wherein a size in plan view of the first flash memory chip is larger than that of the controller chip.

27. The IC card according to claim 20,
wherein the side of the cap in which the second recess is provided is parallel to the first direction in which the IC card is inserted into the electronic device.

28. The IC card according to claim 20, wherein the cap has a first side and a second side parallel to the first direction in which the IC card is inserted into the electronic device, the first side is shorter than the second side, and the second recess is provided in the first side of the cap.

29. The IC card according to claim 20, wherein the cap has a first side and a second side parallel to the first direction in which the IC card is inserted into the electronic device, the second recess is provided in the first side of the cap, and the second side is not provided with a second recess.

30. An IC card comprising:
a cap which has a first surface and a second surface, which is a reverse surface thereof;
an electronic part body that is fitted in and bonded to a first recess of the second surface of the cap,
wherein a second recess for preventing the IC card from falling off or popping out of an electronic device is provided at a side of the cap,
wherein a length of the second recess is formed to be longer than the width of a frame part of an outer circumference of the first recess of the cap, and
wherein a depth of the second recess in a thickness direction of the cap is formed to terminate in an intermediate portion of the thickness of the cap so that the second recess does not penetrate the first recess.

31. The IC card according to claim 30,
wherein the depth of the second recess is one third to two thirds of the thickness of the cap.

32. The IC card according to claim 30,
wherein the depth of the second recess is two fifths to three fifths of the thickness of the cap.

33. The IC card according to claim 30,
wherein the second recess is provided on one side of the cap.

34. The IC card according to claim 30,
wherein the IC card has dimensions in plan view of 24 mm by 18 mm,
wherein the electronic part body comprises a sealing part, a first flash memory chip, and a controller chip for the first flash memory chip, and
wherein the first flash memory chip and the controller chip are sealed by the sealing part.

35. The IC card according to claim 34, further comprising a second flash memory chip,
wherein the second flash memory chip is stacked over the first flash memory chip.

36. The IC card according to claim 34,
wherein a size in plan view of the first flash memory chip is larger than that of the controller chip.

37. The IC card according to claim 30,
wherein the side of the cap in which the second recess is provided is parallel to a first direction in which the IC card is inserted into the electronic device.

38. The IC card according to claim 30, wherein the cap has a first side and a second side parallel to a first direction in which the IC card is inserted into the electronic device, the first side is shorter than the second side, and the second recess is provided in the first side of the cap.

39. The IC card according to claim 30, wherein the cap has a first side and a second side parallel to a first direction in which the IC card is inserted into the electronic device, the second recess is provided in the first side of the cap, and the second side is not provided with a second recess.

* * * * *